(12) United States Patent
Chang et al.

(10) Patent No.: US 11,177,540 B2
(45) Date of Patent: Nov. 16, 2021

(54) MANUFACTURING METHODS FOR NEGATIVE TAB AND POSITIVE TAB OF POUCH CELL

(71) Applicant: GUS TECHNOLOGY CO., LTD., New Taipei (TW)

(72) Inventors: Chung-Chieh Chang, Taichung (TW); Kuo-Wei Yeh, Taichung (TW)

(*) Notice: Subject to any disclaimer, the term of this patent is extended or adjusted under 35 U.S.C. 154(b) by 46 days.

(21) Appl. No.: 16/148,659

(22) Filed: Oct. 1, 2018

(65) Prior Publication Data

US 2019/0165352 A1  May 30, 2019

(30) Foreign Application Priority Data

Nov. 29, 2017  (TW) .................................. 106141553

(51) Int. Cl.
| | | |
|---|---|---|
| C23C 14/02 | (2006.01) | |
| C23C 14/08 | (2006.01) | |
| C23C 14/34 | (2006.01) | |
| C23C 14/16 | (2006.01) | |
| C23C 14/56 | (2006.01) | |
| H01M 50/531 | (2021.01) | |
| H01M 10/647 | (2014.01) | |

(52) U.S. Cl.
CPC ......... *H01M 50/531* (2021.01); *C23C 14/022* (2013.01); *C23C 14/083* (2013.01); *C23C 14/165* (2013.01); *C23C 14/34* (2013.01); *C23C 14/562* (2013.01); *H01M 10/647* (2015.04)

(58) Field of Classification Search
None
See application file for complete search history.

(56) References Cited

U.S. PATENT DOCUMENTS

| | | | | |
|---|---|---|---|---|
| 2004/0224225 A1* | 11/2004 | Yamashita | ............... | H01M 2/26 429/181 |
| 2007/0166528 A1* | 7/2007 | Barnes | ..................... | B05D 7/02 428/304.4 |
| 2016/0068957 A1* | 3/2016 | Wadley | ................... | C23C 14/16 427/534 |

FOREIGN PATENT DOCUMENTS

KR  20170142625 A  * 12/2017

* cited by examiner

*Primary Examiner* — Jose I Hernandez-Kenney
(74) *Attorney, Agent, or Firm* — Egbert, McDaniel & Swartz, PLLC

(57) ABSTRACT

A method for manufacturing a negative tab of a pouch cell includes following step of cleaning and surface roughening a copper foil substrate, plating a nickel film, cleaning and surface roughening the nickel film, plating a passivated metal film and cleaning and surface roughening the passivated metal film. A method for manufacturing a positive tab of a pouch cell includes following step of cleaning and surface roughening an aluminum foil substrate, plating a passivated metal film and cleaning and surface roughening the passivated metal film.

3 Claims, 8 Drawing Sheets

MANUFACTURING METHODS FOR NEGATIVE TAB AND POSITIVE TAB OF POUCH CELL

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates to manufacturing methods, and more particularly to manufacturing methods for a negative tab and a positive tab of a pouch cell.

2. Description of Related Art Including Information Disclosed Under 37 CFR 1.97 and 37 CFR 1.98

The marketed lithium cells are divided into three types including cylinder type, square column type and pouch type, wherein the pouch cell includes the following advantages relative to the cylinder cell and the square column cell. The porch cell is packaged by an aluminum laminated film such that the pouch cell is expanded and breached when having a safety problem. However, the cylinder type and square column type usually have a steel casing or an aluminum casing and may explode when having a safety problem. The weight of the pouch cell is decreased about 40% relative to a lithium battery having a steel casing, and decreased about 20% relative to a lithium battery having an aluminum casing. Consequently, the pouch cell has an energy density higher that of the lithium battery and an internal resistance less that of the lithium battery. As a result, the pouch cell can greatly reduce a power consumption. The pouch cell has a changeable shape and can be thinned relative to the lithium battery such that the pouch cell can be customized for a new standard of batteries.

However, the conventional method for manufacturing the negative tab and the positive tab of the pouch cell usually includes the steps of cleaning, and plating or chemical plating so as to have the following disadvantages. The plated film may have an uneven thickness and the plated film may be detached from the substrate when the substrate is not completely cleaned. The thickness of the plated film of plating or chemical plating not easily controlled such that the stability of the production batch is not good. The plated profile of plating or chemical plating has a weakened crystallinity such that the surface of the plated film may have holes and caved portions. As a result, the plated film, manufactured by the conventional method, has poor corrosion resistance. A surface of a passivated film of the negative/positive tab manufactured by the conventional method is not roughened such that an adhesion between the passivated film and a glue layer is weak and the glue layer may be detached from the passivated film. The above disadvantages will shorten the working life of the pouch cell and further cause a leakage near the negative/positive tab. In addition, the plating or the chemical plating will create waste water including oil, particles, suspended matters, chromate, cyanide and heavy metals. The manufacturing cost of the negative/positive tab will be greatly raised when recycling the waste water. The waste water can seriously pollute the living environment.

The present invention has arisen to mitigate and/or eliminate the disadvantages of the conventional manufacturing method for the negative tab and the positive tab of a pouch cell.

BRIEF SUMMARY OF THE INVENTION

The main objective of the present invention is to provide improved manufacturing methods for a negative tab and a positive tab of a pouch cell for making the negative tab and the positive tab of the pouch cell anti-corrosive.

To achieve objective, the manufacturing method for negative tab of pouch cell in accordance with the present invention comprises the following steps. First, cleaning and surface roughening a copper foil substrate in which a gaseous fluid is decomposed into high reactivity particles including ion, electronic and free radicals by using plasma. These high reactivity particles clean and roughen a surface of a copper foil substrate for promoting a surface roughness of the copper foil substrate under a room temperature of about 15° C. to 30° C. Second, plating onto the roughened surface of the copper foil substrate by vacuum sputtering, wherein the surface roughened copper foil substrate promotes an adhesive quality between the copper foil substrate and the nickel film. Third, cleaning and surface roughening the nickel film with a gaseous fluid decomposed into high reactivity particles including ion, electronic and free radical by using plasma. These high reactivity particles clean and roughen the surface of the nickel film for promoting a surface roughness of the nickel film under a room temperature of about 15° C. to 30° C. Fourthly, plating a passivated metal film onto the nickel film by vacuum sputtering, wherein the passivated metal film is provided to protect the negative tab from being corroded by electrolytes and the surface roughened nickel film is provided to promote an adhesive quality between the passivated metal film and the nickel film. Then, cleaning and surface roughening the passivated metal film with a gaseous fluid decomposed into high reactivity particles including ion, electronic and free radical by using plasma. These high reactivity particles clean and roughen a surface of the passivated metal film for promoting a surface roughness of the passivated metal film under a room temperature of about 15° C. to 30° C. A manufacturing method for positive tab of pouch cell in accordance with the present invention comprises the following steps. First, cleaning and surface roughening an aluminum foil substrate with a gaseous fluid decomposed into high reactivity particles including ion, electronic and free radical by using plasma. These high reactivity particles clean and roughen a surface of an aluminum foil substrate for promoting a surface roughness of the aluminum foil substrate under a room temperature of about 15° C. to 30° C. Second, plating a passivated metal film onto a roughened surface of the aluminum foil substrate by vacuum sputtering, wherein the passivated metal film is provided to protect the positive tab from being corroded by electrolytes and the roughened surface of the aluminum foil substrate is provided to promote an adhesive quality between the passivated metal film and the aluminum foil substrate. Third, cleaning and surface roughening the passivated metal film with a gaseous fluid decomposed into high reactivity particles including ion, electronic and free radical by using plasma. These high reactivity particles clean and roughen a surface of the passivated metal film and promote a surface roughness of the passivated metal film under a room temperature about 15° C. to 30° C.

Further benefits and advantages of the present invention will become apparent after a careful reading of the detailed description with appropriate reference to the accompanying drawings.

DETAILED DESCRIPTION OF THE INVENTION

Figure 1:
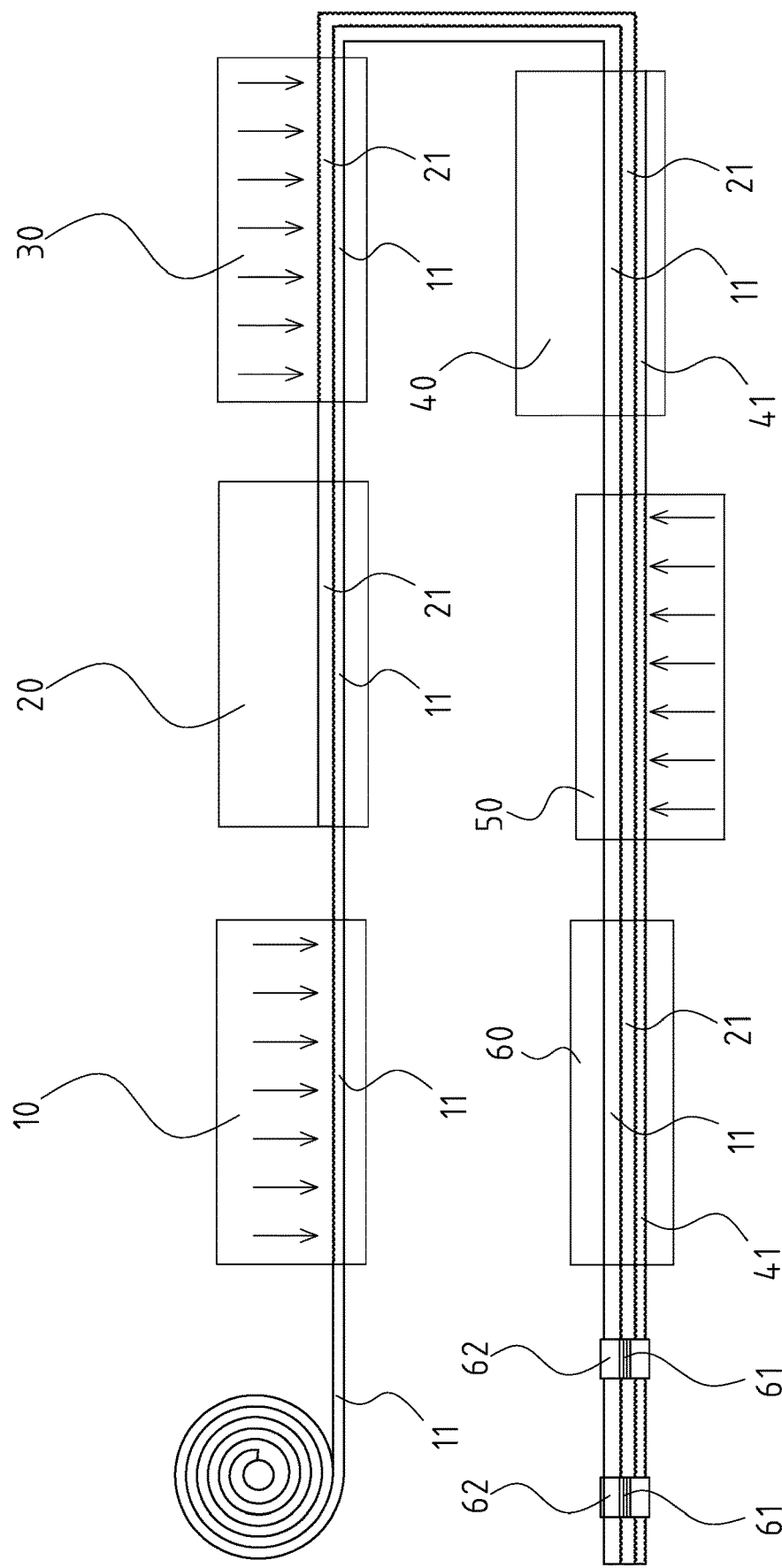
FIG. 1 is a single side manufacturing flow chart of a negative tab of a pouch cell in accordance with the present invention.

Referring to the drawings and initially to FIG. 1, a single side manufacturing method of a negative tab of a pouch cell in accordance with the present invention comprises the following steps.

Figure 5:
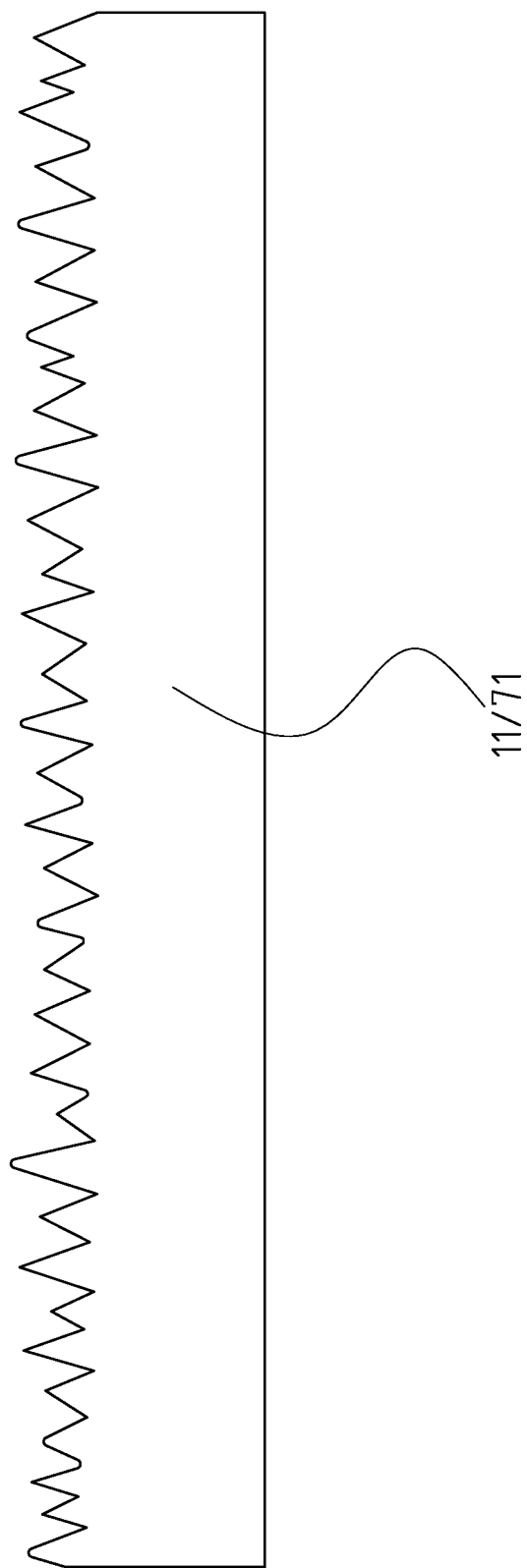
FIG. 5 is a cross-sectional view of a copper/aluminum foil substrate after a step of surface roughening.

Cleaning and surface roughening a copper foil substrate 10 with a gaseous fluid that is decomposed into high reactivity particles including ion, electronic and free radical by using plasma. These high reactivity particles clean and roughen a surface of a copper foil substrate 11, including removing oil and impurity and promoting a surface roughness of the copper foil substrate 11, under a room temperature about 15° C. to 30° C. In the preferred embodiment of the present invention, the operating time of the step of cleaning and surface roughening the copper foil substrate 10 is five minutes and the operating pressure is five mTorr. The gaseous fluid is selected from the group consisting of hydrogen, argon and oxygen, wherein the gas flow is set about 5 sccm (standard-state cubic centimeter per minute) when the hydrogen is selected, the gas flow is set about 20 sccm when the argon is selected and the gas flow is set about 20 sccm when the oxygen is selected. With reference to FIG. 5, the copper foil substrate 1l has a roughened surface.

Plating a nickel film 20 onto the roughened surface of the copper foil substrate 11 by vacuum sputtering, wherein the nickel film 21 has a thickness of about 1-2 µm. In this step, the operating pressure is set about 10 mTorr and the copper foil substrate 11 is pre-heated to 300° C. before the step of plating the nickel film 20 so as to promote an adhesion between the copper foil substrate 1l and the nickel film 21. The surface roughened copper foil substrate 11 is provided to promote an adhesive quality between the copper foil substrate 11 and the nickel film 21. In this step, the hydrogen and the argon are added into the sputtering surroundings, wherein a gas flow of the hydrogen is set about 5 sccm and a gas flow of the argon is set about 25 sccm.

Cleaning and surface roughening the nickel film 30 with a gaseous fluid decomposed into high reactivity particles including ion, electronic and free radical by using plasma. These high reactivity particles clean and roughen the surface of the nickel film 21, including removing oil and impurities and promoting a surface roughness of the nickel film 21, under a room temperature about 15° C. to 30° C. In the preferred embodiment of the present invention, the operating time of the step of cleaning and surface roughening the nickel film 30 is ninety seconds and the operating pressure is 2 mTorr. The gaseous fluid is selected from the group consisting of hydrogen, argon and oxygen, wherein the gas flow is set about 5 sccm when the hydrogen is selected, the gas flow is set about 20 sccm when the argon is selected and the gas flow is set about 20 sccm when the oxygen is selected.

Figure 8:
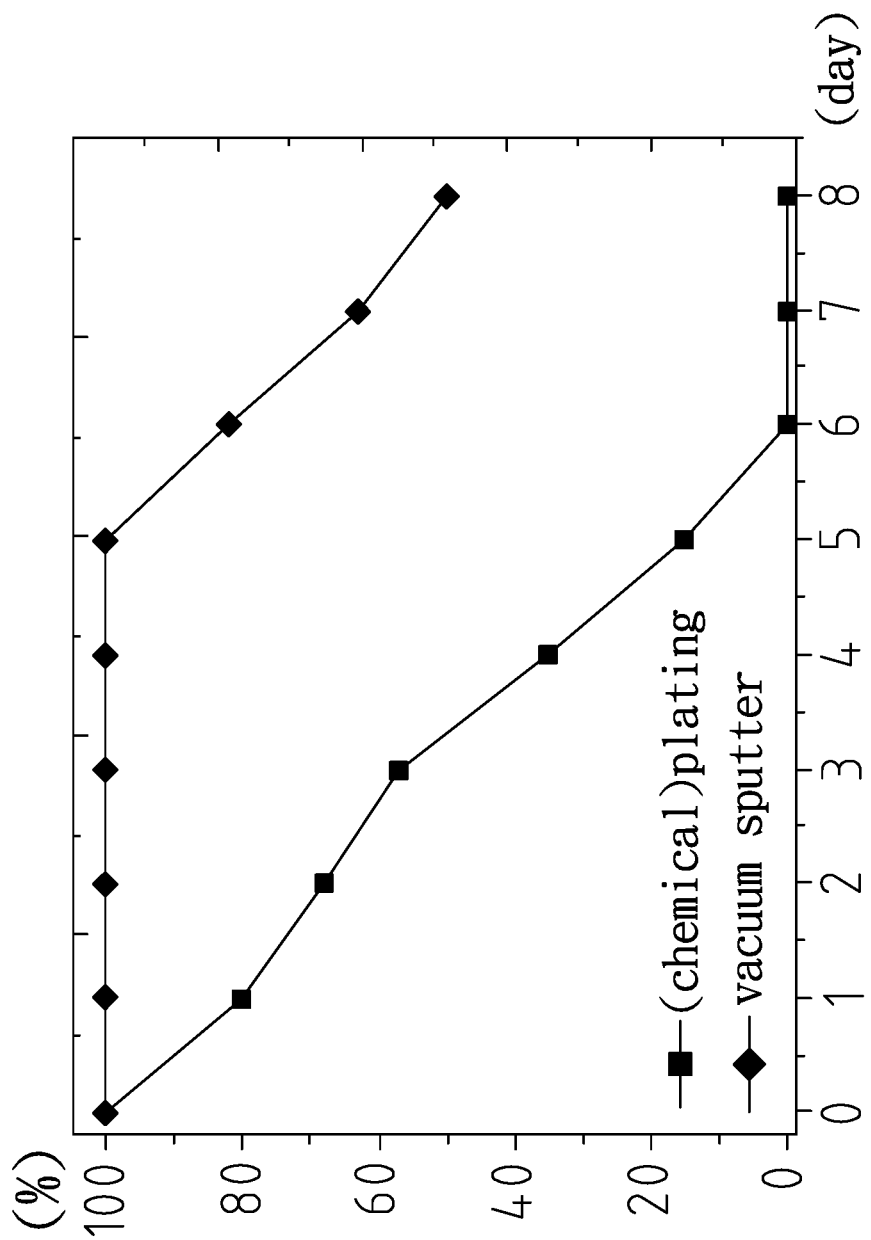
FIG. 8 is a comparison chart for the nickel film by conventional plating or chemical plating and the nickel film by the vacuum sputter after an anti-corrosion test.

Plating a passivated metal film 40 onto the nickel film 21 by vacuum sputtering, wherein the passivated metal film 41 is provided to protect the negative tab from being corroded by electrolytes and lengthen a working life of the pouch cell that uses the negative tab. The material of the passivated metal film 41 is selected from the group consisting of chromium and titanium. In the preferred embodiment of the present invention, the chromium is selected. The passivated metal film 41 has a thickness of about 100~200 nm. In this step, the operating pressure is set about 5 mTorr. Furthermore, the copper foil substrate 11 with the nickel film 21 is pre-heated to 300° C. before the step of plating a passivated metal film 40 so as to promote an adhesion between the passivated metal film 41 and the nickel film 21. The surface roughened nickel film 21 is provided to promote an adhesive quality between the passivated metal film 41 and the nickel film 21. In this step, the hydrogen and the argon are added into the sputtering surroundings, wherein a gas flow of the hydrogen is set about 5 sccm and a gas flow of the argon is set about 20 sccm. With reference to FIG. 8, a comparison chart is shown for the nickel film by conventional plating or chemical plating and the nickel film 21 by the vacuum sputtering after an anti-corrosion. As shown the thickness of the nickel film by conventional plating or chemical plating is quickly corroded and thinned. On the sixth day the nickel film by conventional plating or chemical plating has almost disappeared. In contrast, the nickel film 21, by the vacuum sputtering, is gradually corroded on the fifth day and has 50% thickness relative to the original thickness on the eighth day. Once the negative tab is corroded and thinned, a leakage will be occurred between an aluminum laminated film and the negative tab of the pouch cell.

Cleaning and surface roughening the passivated metal film 50 with a gaseous fluid that is decomposed into high reactivity particles including ion, electronic and free radical by using plasma. These high reactivity particles clean and roughen a surface of the passivated metal film 41, including removing oil and impurity impurities and promoting a surface roughness of the passivated metal film 41, under a room temperature about 15° C. to 30° C. In the preferred embodiment of the present invention, the operating time of the step of cleaning and surface roughening the passivated metal film 50 is ninety seconds and the operating pressure is 2 mTorr. The gaseous fluid is selected from the group consisting of hydrogen, argon and oxygen, wherein the gas flow is set about 5 sccm when the hydrogen is selected, the gas flow is set about 20 sccm when the argon is selected and the gas flow is set about 20 sccm when the oxygen is selected. A metal oxide film of chromium trioxide ($Cr_2O_3$) is further formed on the passivated metal film 41 when the material of the passivated metal film 41 is chromium and the gaseous fluid is oxygen. The chromium trioxide has an anti-corrosive material behavior such that the metal oxide film of chromium trioxide can protect the negative tab from being corroded by electrolytes.

Figure 2:
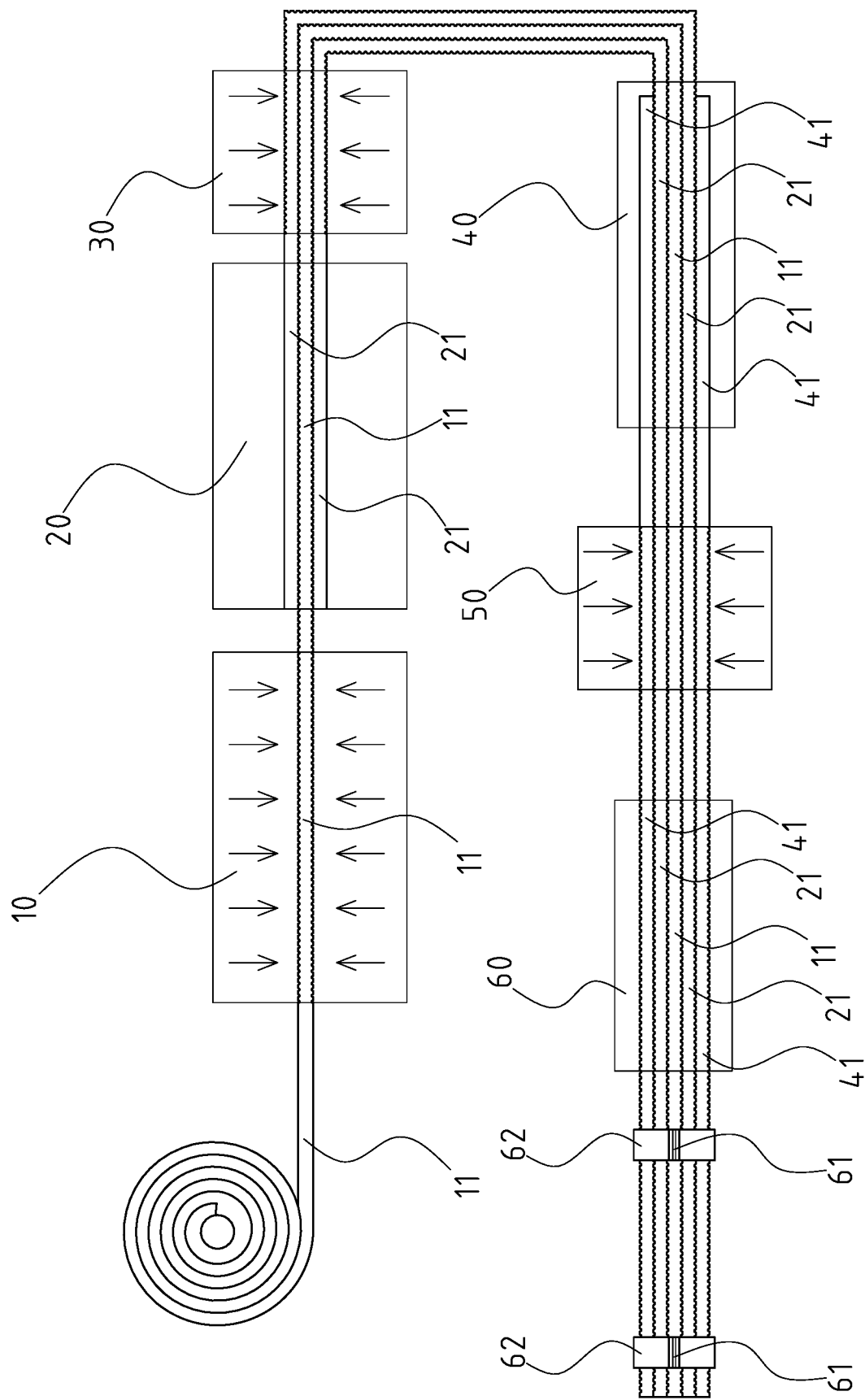
FIG. 2 is a double sided manufacturing flow chart of a negative tab of a pouch cell in accordance with the present invention.

The above steps are provided to process on one side of the copper foil substrate 11. With reference to FIG. 2, the above steps can be processed on two opposite sides of the copper foil substrate 11 at the same time for simplifying the processes of the negative tab of the pouch cell and increasing the production capacity of the negative tab of the pouch cell.

Figure 6:
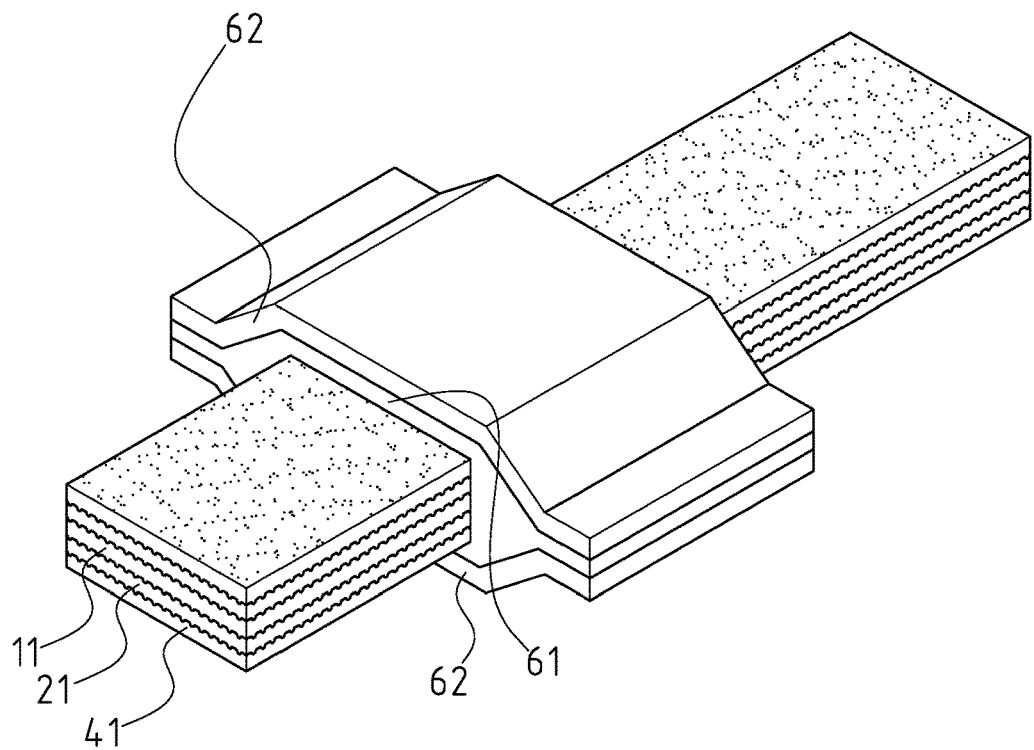
FIG. 6 is a perspective view of the negative tab in accordance with the present invention after being glued.
Figure 7:
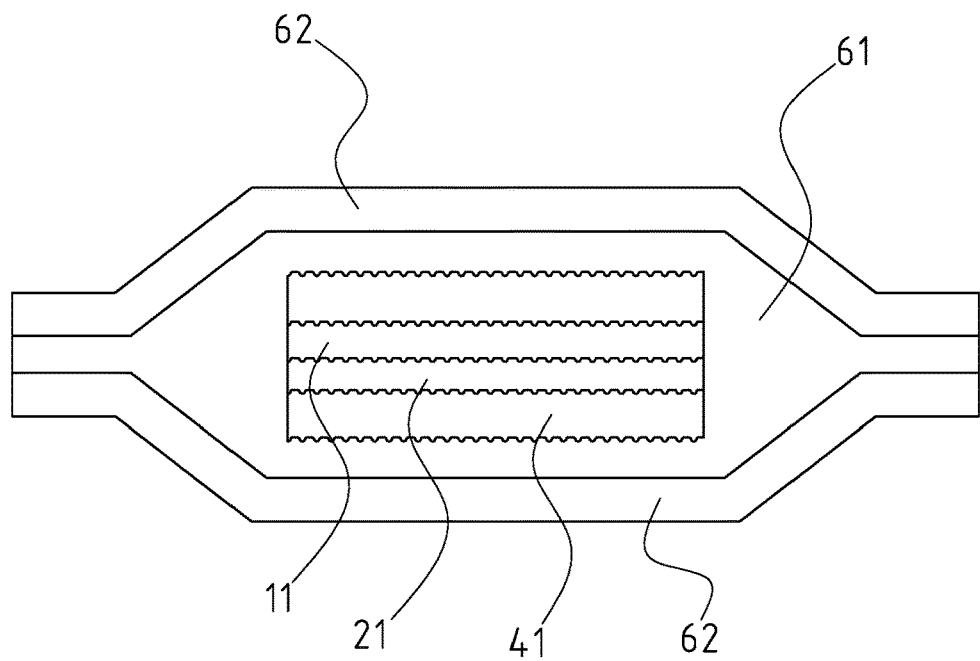
FIG. 7 is a cross-sectional view of the negative tab in accordance with the present invention after being glued.

With reference to FIGS. 6 and 7, the manufacturing method of a negative tab of a pouch cell in accordance with the present invention further comprises a step of gluing 60. The step of gluing 60 is provided to form a glue layer 61 partially surrounding the negative tab processed by the above steps. The glue payer 61 has two opposite sides each having an insulating tape 62 adhered thereon. The steps of forming the glue layer 61 and adhering the insulating tape 61 can be finished at the same time for simplifying the processes of the negative tab of the pouch cell. The negative tab is a metal conductor for guiding a negative electricity from a battery. The negative tab with the glue layer 61 and insulating tapes 62 can prevent the negative tab of the pouch cell from a short circuit with the aluminum laminated film of the pouch cell. The surface roughened passivated metal film 41 promotes an adhesion between the passivated metal film 41 and the glue layer 61. The step of gluing 60 can be individually operated or coupled to the automated processes as shown in FIGS. 1 and 2.

Figure 3:
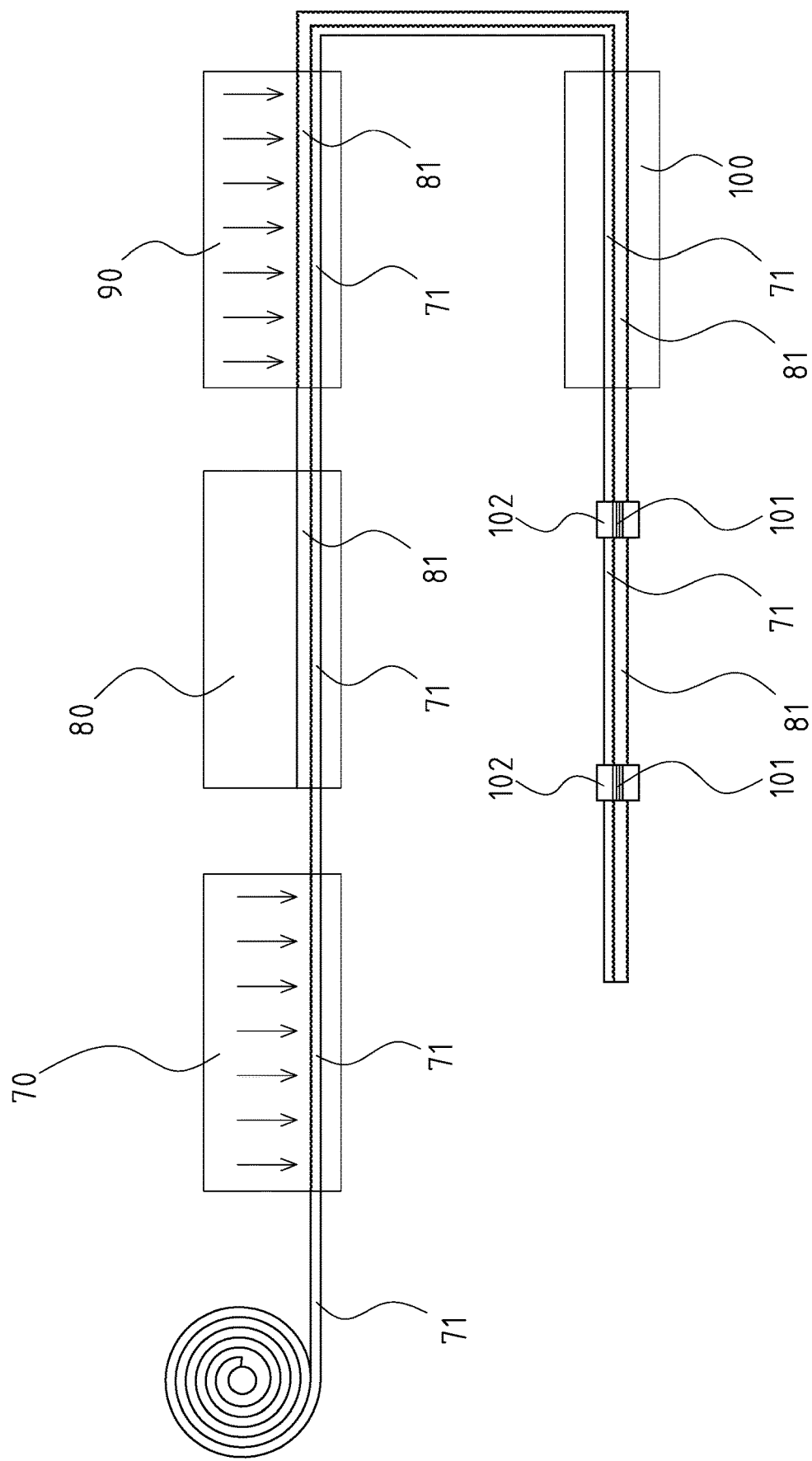
FIG. 3 is a single side manufacturing flow chart of a positive tab of a pouch cell in accordance with the present invention.

Referring to the drawings and initially to FIG. 3, a single side manufacturing method of a positive tab of a pouch cell in accordance with the present invention comprises the following steps.

Cleaning and surface roughening an aluminum foil substrate 70 with a gaseous fluid decomposed into high reactivity particles including ion, electronic and free radical by using plasma. These high reactivity particles clean and roughen a surface of an aluminum foil substrate 71, including removing oil and impurities and promoting a surface roughness of the aluminum foil substrate 71, under a room temperature about 15° C. to 30° C. In the preferred embodiment of the present invention, the operating time of the step of cleaning and surface roughening an aluminum foil substrate 10 is five minutes and the operating pressure is 5 mTorr. The gaseous fluid is selected from the group consisted of hydrogen, argon and oxygen, wherein the gas flow is set about 5 sccm when the hydrogen is selected, the gas flow is set about 20 sccm when the argon is selected and the gas flow is set about 20 sccm when the oxygen is selected. With reference to FIG. 5, the aluminum foil substrate 11 has a roughened surface.

Plating a passivated metal film 80 onto the surface roughened aluminum foil substrate 71 by vacuum sputtering, wherein the passivated metal film 81 is provided to protect the negative tab from being corroded by electrolytes and lengthen a working life of the pouch cell that using the positive tab made by the method in accordance with the present invention. The material of the passivated metal film 81 is selected from the group consisting of chromium and titanium. In the preferred embodiment of the present invention, the chromium is selected. The passivated metal film 81 has a thickness about 100~200 nm. In the step, the operating pressure is set about 5 mTorr. Furthermore, the aluminum foil substrate 71 is pre-heated to 300° C. before the step of plating the passivated metal film 80 for promoting an adhesion between the passivated metal film 81 and the aluminum foil substrate 71. The surface roughened aluminum foil substrate 71 is provided to promote an adhesive quality between the passivated metal film 81 and the aluminum foil substrate 71. In the step, the hydrogen and the argon are added into the sputtering surroundings, wherein a gas flow of the hydrogen is set about 5 sccm and a gas flow of the argon is set about 20 sccm.

Cleaning and surface roughening the passivated metal film 90 with a gaseous fluid decomposed into high reactivity particles including ion, electronic and free radical by using plasma. These high reactivity particles clean and roughen a surface of the passivated metal film 81, including removing oil and impurities and promoting a surface roughness of the passivated metal film 81, under a room temperature about 15° C. to 30° C. In the preferred embodiment of the present invention, the operating time of the step of cleaning and surface roughening the passivated metal film 90 is ninety seconds and the operating pressure is 2 mTorr. The gaseous fluid is selected from the group consisting of hydrogen, argon and oxygen, wherein the gas flow is set about 5 sccm when the hydrogen is selected, the gas flow is set about 20 sccm when the argon is selected and the gas flow is set about 20 sccm when the oxygen is selected. A metal oxide film of chromium trioxide ($Cr_2O_3$) is further formed on the passivated metal film 81 when the material of the passivated metal film 81 is chromium and the gaseous fluid is oxygen. The chromium trioxide has an anti-corrosive material behavior such that the metal oxide film of chromium trioxide can protect the positive tab from being corroded by electrolytes.

Figure 4:
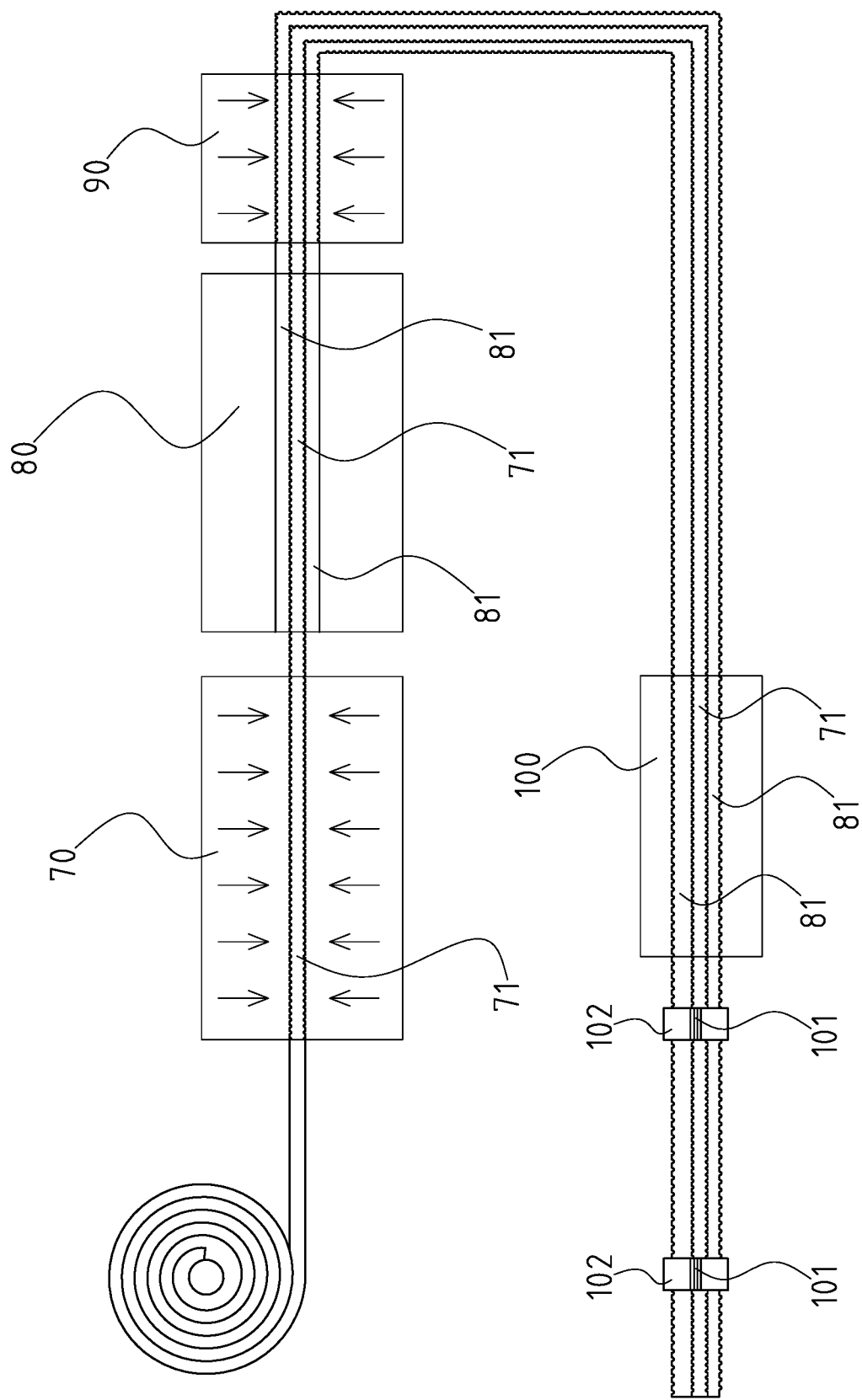
FIG. 4 is a double sided manufacturing flow chart of a positive tab of a pouch cell in accordance with the present invention.

The above steps are provided to process on one side of the aluminum foil substrate 71. With reference to FIG. 4, the above steps can be processed on two opposite sides of the aluminum foil substrate 71 at the same time for simplifying the processes of the positive tab of the pouch cell and increasing the production capacity of the positive tab of the pouch cell.

Figure 9:
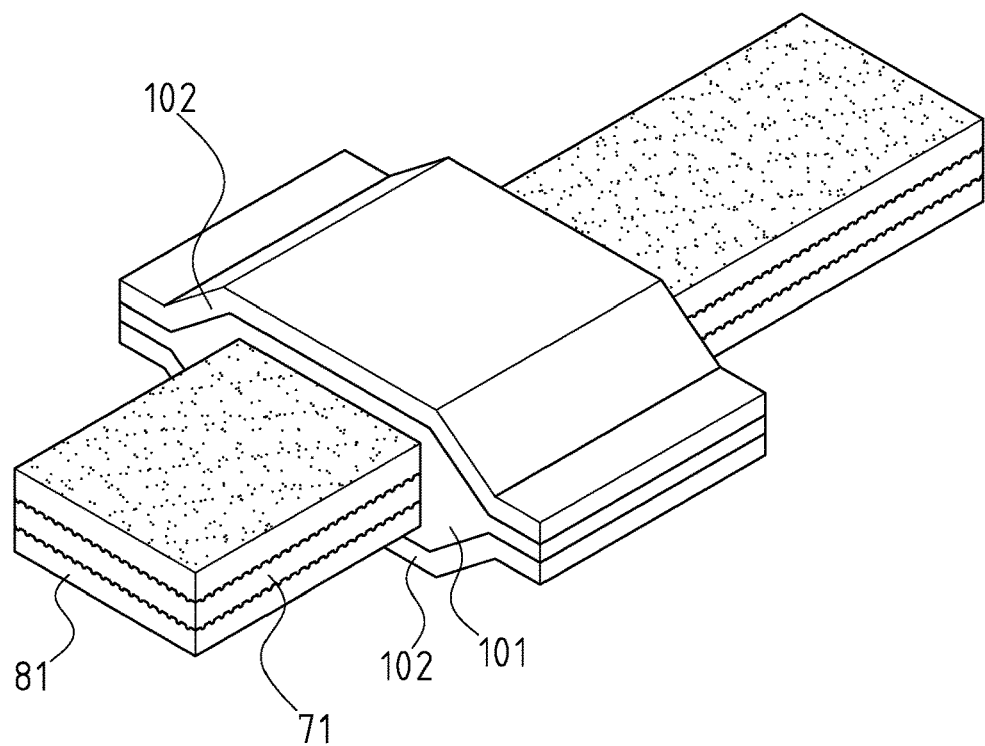
FIG. 9 is a perspective view of the positive tab in accordance with the present invention after being glued.
Figure 10:
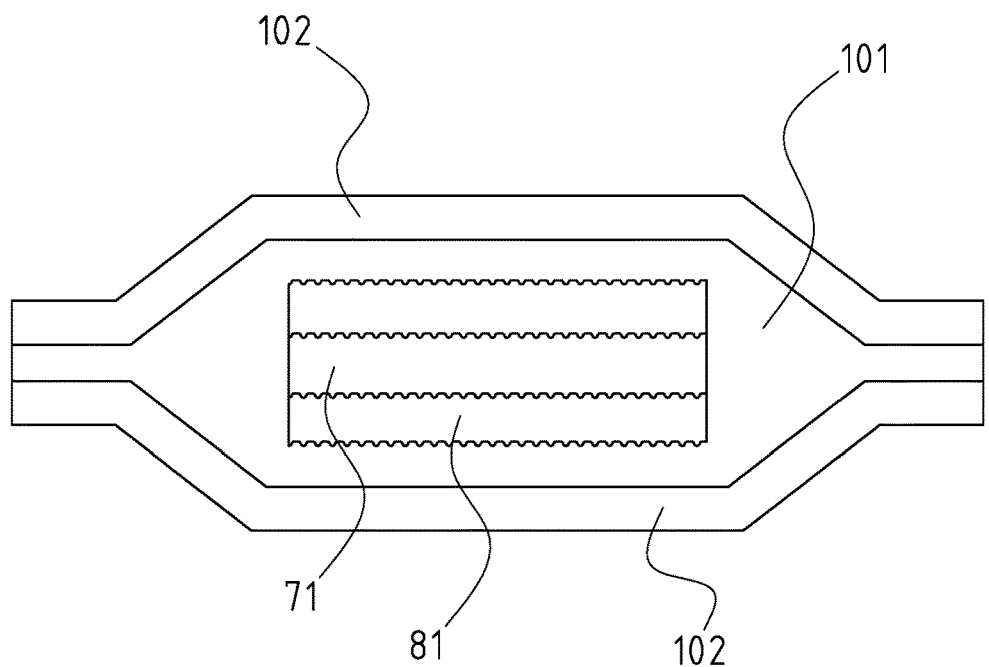
FIG. 10 is a cross-sectional view of the positive tab in accordance with the present invention after being glued.

With reference to FIGS. 9 and 10, the manufacturing method of a positive tab of a pouch cell in accordance with the present invention further comprises a step of gluing 100. The step of gluing 100 is provided to form a glue layer 101 partially surrounding the positive tab processed by the above steps. The glue layer 101 has two opposite sides each having an insulating tape 102 adhered thereon. The steps of forming the glue layer 101 and adhering the insulating tape 102 can be finished at the same time for simplifying the processes of the positive tab of the pouch cell. The positive tab is a metal conductor for guiding a positive electricity from a battery. The positive tab with the glue layer 101 and insulating tapes 102 can prevent the positive tab of the pouch cell from a short circuit with the aluminum laminated film of the pouch cell. The surface roughened passivated metal film 81 promotes an adhesion between the passivated metal film 81 and the glue layer 61. The step of gluing 100 can be individually operated or coupled to the automated processes as shown in FIGS. 3 and 4.

As described above, the manufacturing methods for the negative tab and h positive tab of the pouch cell use plasma to clean and roughen a surface of the copper foil substrate/aluminum foil substrate 11/71 and plating the passivated metal film 41/81 by vacuum sputtering. As shown in FIG. 8, the thickness of the nickel film by conventional plating or chemical plating is quickly corroded and thinned. On the sixth day, the nickel film by conventional plating or chemical plating has almost disappeared. In contrast, the nickel film 21, by the vacuum sputtering, is gradually corroded on the fifth day and has 50% thickness relative to the original thickness on the eighth day. Obviously, the corrosion-resistance of the negative/positive tab of the pouch cell manufactured by the methods in accordance with the present invention is better than that of the conventional negative/positive tab of the pouch cell. In addition, the passivated metal film 41/81 is cleaned and roughened by plasma such that the adhesion between the passivated metal film 41/81 and the glue layer 61/101 is promoted to 20 N/cm. However, the adhesion between the passivated film and the glue layer of the conventional negative/positive tab is only 7 N/cm. As a result, the safety of the pouch cell and a leakproofness between the tabs and the aluminum laminated film of the porch cell are promoted.

Although the invention has been explained in relation to its preferred embodiment, it is to be understood that many other possible modifications and variations can be made without departing from the spirit and scope of the invention as hereinafter claimed.

We claim:

1. A method of manufacturing a positive tab of a pouch cell, the method comprising:
    cleaning and surface roughening an aluminum foil substrate in an elongate form at room temperature with a gaseous fluid decomposed into high reactivity particles including ions and electronic and free radicals by using plasma, the elongate form having one dimension being larger in one direction than another dimension in a transverse direction;
    plating a passivated metal film onto the roughed surface of the aluminum foil substrate by vacuum sputtering, the plated passivated metal film protecting the positive tab of the pouch cell from being corroded by electrolytes, wherein the passivated metal film is chromium;
    cleaning and surface roughening the passivated metal film at a temperature range of 15° C. to 30° C. with oxygen decomposed into high reactivity particles including ions and electronic and free radicals by using plasma, a metal oxide film being formed on the passivated metal film, the metal oxide film being chromium trioxide; and
    gluing so as to form a glue layer partially surrounding the positive tab, the glue layer having two opposite sides each having an insulating tape adhered thereon, the aluminum foil substrate in the elongate form forming the positive tab, wherein the step of cleaning and surface roughening the aluminum foil substrate has an operating time of five minutes and an operating pressure of five mTorr, the gaseous fluid selected from the group consisting of hydrogen, argon and oxygen, the gaseous fluid having a flow rate of five sccm where hydrogen is selected, the gaseous fluid having a flow rate of twenty sccm where argon is selected, the gaseous fluid having a flow rate of twenty sccm when oxygen is selected, wherein during the step of plating the passivated metal film, hydrogen and argon surround the vacuum sputtering, the hydrogen having a flow rate of five sccm and the argon having a flow rate of twenty sccm.

2. The method of claim 1, wherein the steps of cleaning and surface roughening the aluminum foil substrate and cleaning and surface roughening the passivated metal film occurring on opposite sides of the aluminum foil substrate.

3. The method of claim 1, wherein the step of cleaning and surface roughening the passivated metal film has an operating time of ninety seconds and an operating pressure of two mTorr, wherein the oxygen includes hydrogen having a flow rate of five sccm or argon having a flow rate of twenty sccm.

* * * * *